United States Patent
Maddala et al.

(10) Patent No.: US 6,337,571 B2
(45) Date of Patent: *Jan. 8, 2002

(54) ULTRA-HIGH-FREQUENCY CURRENT PROBE IN SURFACE-MOUNT FORM FACTOR

(75) Inventors: Vivek Maddala, Portland; R. Kenneth Price, Tigard; Shawn C. Murphy, Hillsboro; Albert S. Crane, Portland, all of OR (US)

(73) Assignee: Tektronix, Inc., Beaverton, OR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/190,967

(22) Filed: Nov. 13, 1998

(51) Int. Cl.[7] ............... G01R 31/02; G01R 33/00; G01R 1/14; G01R 31/08
(52) U.S. Cl. ............ 324/754; 324/117 R; 324/127; 324/522
(58) Field of Search ................. 324/754, 763, 324/755, 117 R, 127, 522; 336/173, 192, 200; 327/127, 522

(56) References Cited

U.S. PATENT DOCUMENTS

| | | | | |
|---|---|---|---|---|
| 3,050,683 A | * | 8/1962 | Anderson | 324/117 R |
| 3,454,879 A | * | 7/1969 | Smitka | 324/117 R |
| 4,506,214 A | * | 3/1985 | Lienhard et al. | 324/117 R |
| 4,908,576 A | * | 3/1990 | Jackson | 324/73.1 |
| 4,967,145 A | * | 10/1990 | Davies | 324/127 |
| 5,004,974 A | | 4/1991 | Cattaneo et al. | |
| 5,191,699 A | * | 3/1993 | Ganslmeier et al. | 29/602.1 |
| 5,430,613 A | * | 7/1995 | Hastings et al. | 361/760 |

* cited by examiner

Primary Examiner—Safet Metjahic
Assistant Examiner—Anjan K Deb
(74) Attorney, Agent, or Firm—David N. Caracappa; Thomas F. Lenihan

(57) ABSTRACT

An ultra high frequency current probe is fabricated in the form of a surface mount device, designed to be a part of the circuit providing the current being observed.

5 Claims, 2 Drawing Sheets

ULTRA-HIGH-FREQUENCY CURRENT PROBE IN SURFACE-MOUNT FORM FACTOR

FIELD OF THE INVENTION

The present invention relates to a current probe for ultra high frequency current measurements.

BACKGROUND OF THE INVENTION

Presently available current probes measure the current flowing through a signal line by being coupled magnetically to the signal line. Some current probes require that the signal line be broken and be threaded through a magnetic core to provide the magnetic coupling. Other current probes do not require that the signal line be disrupted in this manner.

For example, U.S. Pat. No. 5,044,974, issued Apr. 2, 1991 to Cattaneo et al. shows a current probe which includes an assembly on which is mounted an electronic printed circuit board. The assembly includes a magnetic circuit consisting of a stack of metal sheets. The signal whose current is being monitored is sent through a winding around the magnetic circuit. The winding is formed by U shaped conductor portions surrounding three sides of the magnetic circuit in the assembly, and through corresponding conductive traces on the printed circuit board interconnecting the U shaped conductor portions. These traces are laid out to allow the number of windings around the magnetic circuit to be varied. A second winding around the magnetic circuit is used to provide an input to a measuring device. A further provision of a location for a Hall cell within the magnetic circuit allows for the second winding to zero out the net magnetic flux in the magnetic circuit, allowing the device to be used as a nulling sensor. This current probe can be mounted on a main printed circuit board, and operates at relatively low frequencies.

However, all existing ultra high frequency current probes of relatively high sensitivity require that the signal line whose current is being observed be threaded through, and possibly wound around, a closed ferrite high frequency transformer core. In this way, the signal line forms one winding of a transformer. The other winding of the transformer is connected to the test equipment (i.e. oscillo-scope, network analyzer, etc.). In these current probes, the presence of the ferrite core, and the test equipment attached to its winding, causes some amount of change to the electrical characteristics of the circuit. This is because the transformer and the attached test equipment form an electrical element having a finite resistance, and, most likely, a non-zero reactance. Thus, the results of the test do not accurately reflect the operation of the circuit with the current probe removed.

Mechanically, such an arrangement also produces much wear and tear on the circuit being observed. This is because to make a measurement the signal line must be broken, the ferrite core threaded onto the signal line, the signal line reconnected, the measurement made, the signal line broken again, the ferrite core removed and the signal line reconnected again. There is also wear and tear on the current probe itself from this procedure. For production line testing, high volume measurements are performed, often, with automated handling of the product being tested (i.e. by robots). In such an environment, a current probe as described above must be inserted manually in the circuit. The time required for inserting and removing such a current probe is significant.

A current probe which operates at ultra high frequencies, which makes connections between the signal line being observed and the test equipment fast, easy and able to be performed by automated handling, and which can provide a minimal change to the electrical characteristics of the signal being observed is desirable.

SUMMARY OF THE INVENTION

In accordance with principles of the present invention an ultra high frequency current probe is fabricated in the form of a surface mount device, designed to be a part of the circuit providing the current being observed.

Because such a current probe becomes a part of the electrical circuit, it has a minimal effect on the electrical characteristics of the signal being observed. Also there is no manual handling of a current probe during testing.

BRIEF DESCRIPTION OF THE DRAWING

In the drawing:

FIG. 1 is a block diagram of a current probe according to the present invention illustrated in place to measure the current through a signal line;

FIG. 2 is a schematic diagram of the input section of the current probe illustrated in FIG. 1;

FIG. 3 is a schematic diagram of the output section of the current probe illustrated in FIG. 1; and FIG. 4 is a plan view of the top of the surface mount device in which the current probe illustrated in FIG. 1 is embodied.

DETAILED DESCRIPTION OF THE INVENTION

FIG. 1 is a block diagram of an ultra high frequency current probe according to the present invention. The current probe is illustrated in place to measure the current through a signal line. In FIG. 1, an input terminal 5 is coupled to a source (not shown) of an input current signal Iin. This current signal Iin may include ultra high frequency components, typically around two to four gigahertz (GHz). Input terminal 5 is coupled to an input terminal of a signal line in the form of a transmission line, illustrated in FIG. 1 as transmission line 10. In the illustrated embodiment, the transmission line 10 has a 50Ω characteristic impedance. An output terminal of transmission line 10 acts as a source of the current being measured, and is coupled to a current input terminal of a current probe 20. A current output terminal of the probe 20 is coupled to an input terminal of a second transmission line 30 which is the continuation of the signal line carrying the current is being observed. In the illustrated embodiment, the transmission line 30 also has a 50Ω characteristic impedance. The input terminal of the second transmission line 30 acts as a sink for the current being measured. An output terminal of the second transmission line 30 is coupled to an output terminal 15. Output terminal 15 generates a current Iout, and is coupled to the remainder of the circuit being tested (not shown). A test voltage output terminal of the current probe 20 is coupled to a test voltage output terminal Vtest 25. The current probe 20 also includes a terminal coupled to a source of reference potential (ground).

In operation, the current probe 20 produces a voltage between the test voltage output terminal Vtest and ground representing the value of the current passing from the current input terminal to the current output terminal of the current probe 20. However, the current probe 20 also has the electrical characteristics of a 50Ω transmission line. Thus, the presence of the current probe 20 in the signal line being observed has a minimal effect on the electrical characteristics of that signal line, and, therefore, on the remainder of the circuit (not shown) through which that current signal is flowing. Such a current probe 20 has the high frequency performance of a lumped 50Ω transmission line with a short delay and a cut-off frequency of approximately 4 GHz.

Figure 1:
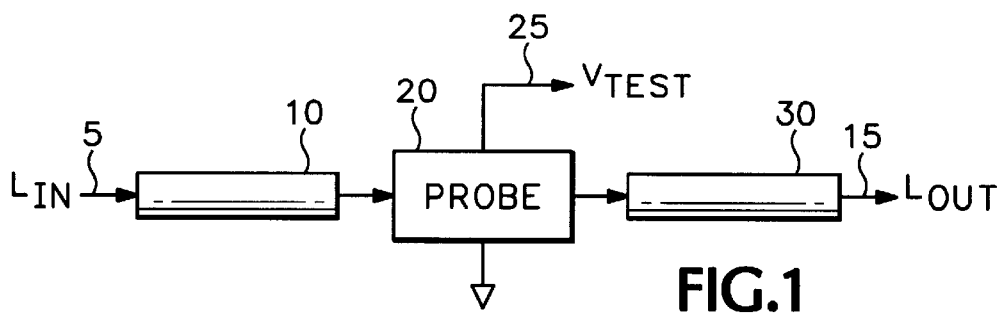
Figure 2:
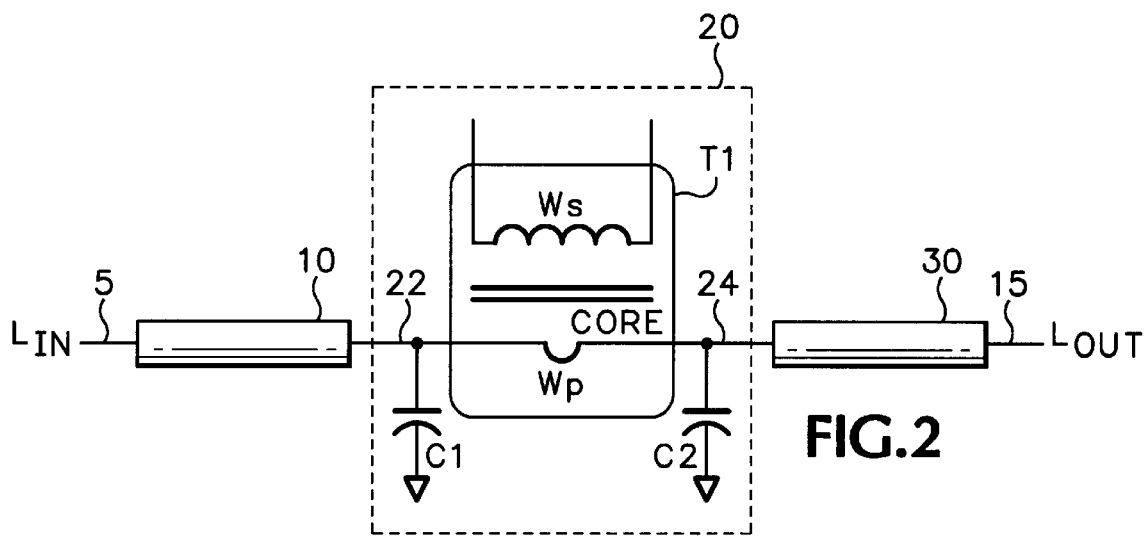

FIG. 2 is a schematic diagram of the input section of the current probe illustrated in FIG. 1. In FIG. 2, elements which are the same as those in FIG. 1 are designated by the same reference number, and are not described in detail below. In FIG. 2, the 50Ω transmission line 10 is coupled to an input terminal 22 of the current probe 20. The input terminal 22 is coupled to a first electrode of a first capacitor C1, and a first electrode of a primary winding Wp of a high frequency transformer T1. A second electrode of the primary winding Wp is coupled to a first electrode of a second capacitor C2 and to an output terminal 24 of the current probe 20. Respective second electrodes of the first and second capacitors, C1 and C2, are coupled to ground. The output terminal 24 of the current probe 20 is coupled to the 50Ω transmission line 30. The primary winding Wp is coupled through a high frequency ferrite core to a secondary winding Ws. The secondary winding Ws produces a voltage signal representing the current flowing through the primary winding in a manner to be described in more detail below.

In operation, the combination of the 50Ω transmission line 10 and 50Ω transmission line 30 carry the signal current. The input terminal 22 transports the signal current from the transmission line 10 into the current probe, and is fabricated in the current probe 20 to have substantially a 50 characteristic impedance. Similarly, the output terminal 24 transports the signal current from the current probe 20 to the transmission line 30, and is also fabricated to have substantially a 50Ω characteristic impedance. The primary winding Wp is fabricated as a sense wire threaded through the high frequency ferrite core between the input and output terminals, 22 and 24. While the signal current is traversing the primary winding, the high frequency transformer T1 converts its electromagnetic flux field into a voltage at the secondary winding Ws. The sense wire is the only location where the characteristic impedance of the signal carrying line potentially can vary from the 50Ω characteristic impedance.

However, the inductance of the primary winding Wp is countered by the first and second capacitors C1 and C2. The combination of the primary winding Wp and the first and second capacitors, C1 and C2, forms a 50Ω lumped network which maintains the 50Ω characteristic impedance of the signal carrying line. In the illustrated embodiment, the primary winding has an impedance of 2.2 nanoHenries (nH). To maintain an impedance of 50Ω in the lumped network the first and second capacitors require capacitances of less than 1.0 picoFarads (pf) each. With such a lumped network the 50 characteristic impedance of the signal line is maintained from the input transmission line 10, into the current probe 20 through input terminal 22, through the high frequency transformer T1, out of the current probe 20 through output terminal 24 and to the output transmission line 30. In this way the effect of the current probe on the signal characteristics of the circuit it is measuring is minimized.

In the illustrated embodiment, the parasitic capacitance of the input terminal 22 and the output terminal 24 are each substantially the desired capacitance of the first and second capacitors C1 and C2. Discrete capacitors, thus, are not necessary in the illustrated embodiment. However, one skilled in the art will understand that different physical arrangements can result in parasitic capacitances having different values, and that different arrangements for the primary winding Wp can have different inductances. In such cases, different values of capacitors C1 and C2 to may be required to form the required 50Ω lumped network. In these arrangements, discrete capacitors may be necessary to provide the required capacitance.

Figure 3:
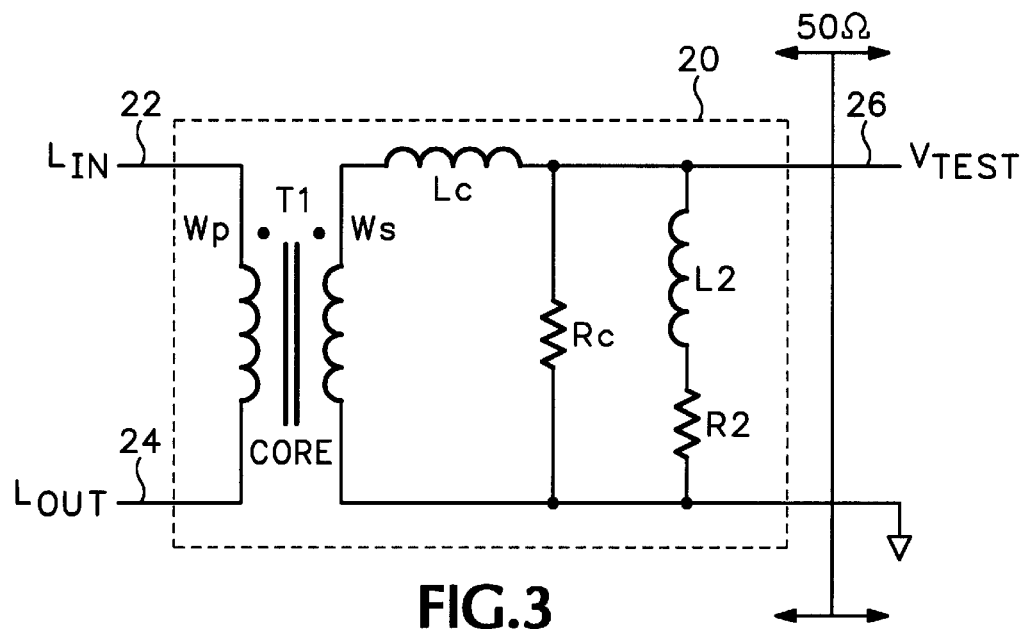

FIG. 3 is a schematic diagram of the output section of the current probe illustrated in FIG. 1. In FIG. 3, elements which are the same as those illustrated in FIGS. 1 and 2 are designated by the same reference number and are not described in detail below. In FIG. 3, a first electrode of the secondary winding Ws of the high frequency transformer T1 is coupled through an equivalent inductance Lc to a first electrode of an equivalent resistance Rc. A second electrode of the resistance Rc is coupled to a second electrode of the secondary winding. The loop formed by the secondary winding Ws, the equivalent inductance Lc and the equivalent resistance Rc represents the equivalent circuit for the transformer T1 secondary winding Ws, in which the secondary winding Ws leakage inductance is Lc and the core loss resistance is Rc.

The second electrode of the equivalent inductance Lc is also coupled to a first electrode of a second inductance L2 and to the test voltage Vtest output terminal 26. A second electrode of the second inductance L2 is coupled to a first electrode of a second resistor R2. A second electrode of the second resistor R2 is coupled to the second electrode of the secondary winding Ws, and to ground. In the illustrated embodiment, the inductance of the second inductance L2 is 8.2 nH, and the resistance of the second resistor R2 is 61.9Ω.

In operation, the current flowing from the current input terminal 22, through the primary winding Wp of the transformer T1 to the current output terminal 24 induces a voltage across the secondary winding Ws in a known manner. The combination of the electrical characteristics (i.e. Lc and Rc) of the secondary winding Ws and the second inductance L2 and second resistor R2 produce an output impedance between the test voltage Vtest output terminal 26 and ground of 50Ω. Provided this output terminal is connected to the test equipment through a 50Ω transmission line, and properly terminated at the test equipment with a 50Ω input impedance, the current probe 20 will produce minimal loading on the circuit being tested.

In order to minimize the time and manual effort necessary to install and remove the current probe, e.g. in a production test environment as described above, the current probe 20 illustrated in FIG. 1 is fabricated as a surface mount device (SMD). This SMD is designed to be a permanent part of the circuit board, e.g. a printed circuit board, containing the signal line being observed. In the illustrated embodiment, the signal line being observed is fabricated on the circuit board as a 50 transmission line by copper traces of appropriate size and spacing on the surface of a circuit board, in a known manner. A gap is left in the copper traces forming the transmission line, thus forming on one side of the gap the input transmission line 10 and on the other side of the gap the output transmission line 30. The current input terminal 22 of the SMD is coupled to the input transmission line 10 and the current output terminal 24 is connected to the output transmission line 30, thus completing the signal line circuit. As described above, because the current probe 20 maintains as closely as possible the 50Ω characteristic impedance of the signal line, the changes to the 50Ω characteristic impedance of the transmission line carrying the signal due to current probe 20 are minimal, and the transmission line environment is maintained as closely as possible.

Figure 4:
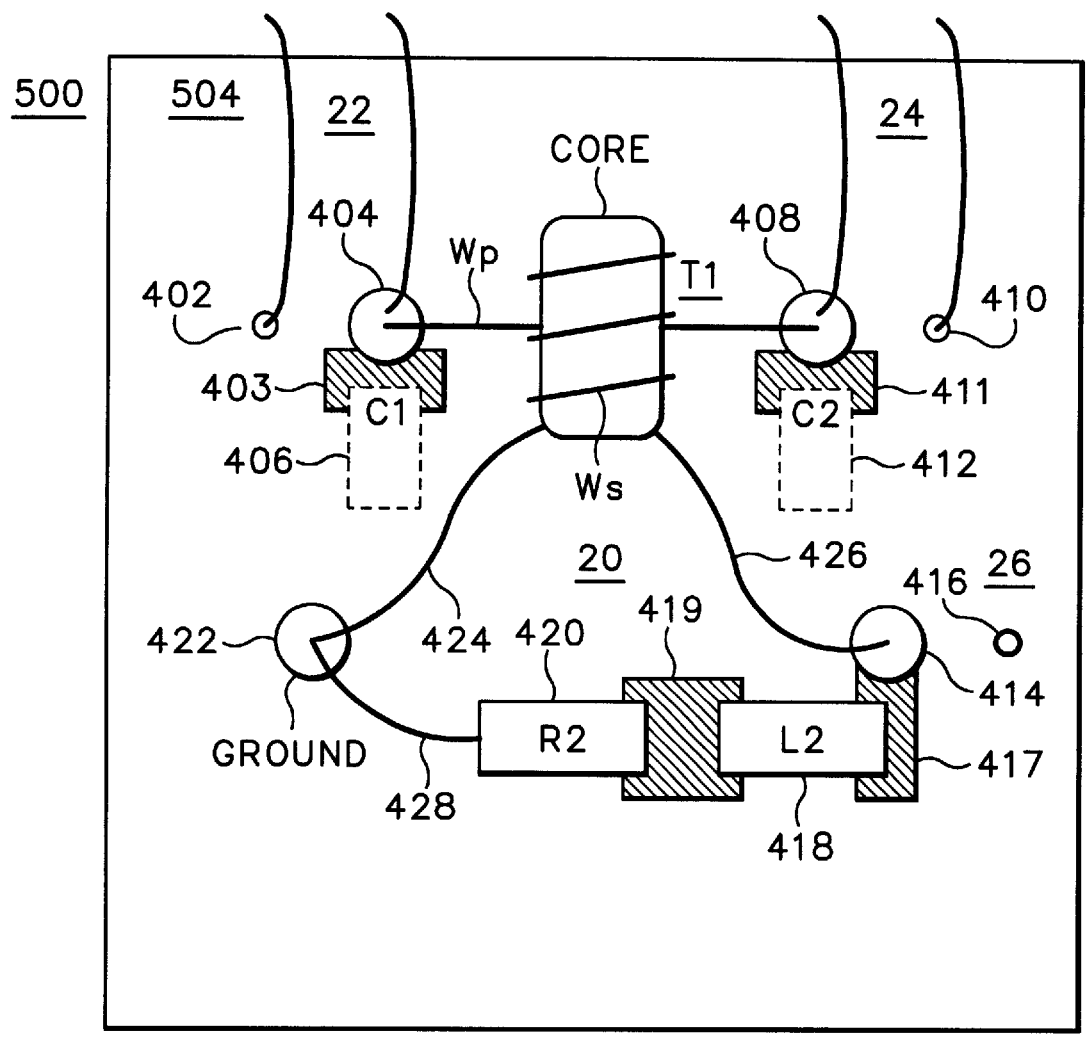

FIG. 4 is a plan view of a top layer 504 of an SMD 500 in which the current probe 20 illustrated in FIG. 1 is embodied. Elements corresponding to those illustrated in FIGS. 1 through 3 are designated by the same reference numbers. The SMD 500 in FIG. 4 includes a ground layer (not shown) within the SMD 500 and arranged parallel to the top layer 504. Solder pads 402 and 404 are coupled to the input transmission line 10 (not shown) via a pair of wires forming the input terminal 22 of the current probe 20. In a similar manner solder pads 408 and 410 are coupled to the output transmission line 30 (also not shown) via a pair of wires forming the output terminal 24. Also a pair of wires (not shown for simplicity) forming the Vtest output terminal 26 and carrying the test voltage Vtest signal is coupled to solder pads 414 and 416. In the illustrated embodiment, the solder pads 402 and 410 and 416 are all connected to respective signal vias which connect them from the top layer 504 of the SMD 500 to the ground layer (not shown).

A sense wire, forming the primary Wp of the high frequency transformer T1 is electrically connected between the input current signal solder pad 404 and the output current signal solder pad 408. The sense wire Wp is threaded through the center of a toroidal high frequency ferrite transformer core, illustrated in side view in FIG. 4.

A secondary winding Ws is wound around the ferrite transformer core, as represented by the diagonal lines in FIG. 4. A first end of the secondary winding Ws is connected through a wire 424 to a solder pad 422 which is coupled to the ground layer through a signal via. A second end of the secondary winding Ws is connected through a wire 426 to the test voltage Vtest signal solder pad 414. The test voltage Vtest signal solder pad 414 is also connected to a first electrode of the inductor L2 via a signal trace 417. A second electrode of the inductor L2 is connected to a first electrode of the resistor R2 via a signal trace 419. A second electrode of the resistor R2 is connected to the ground solder pad 422 through a wire 428. The inductor L2 and resistor R2 are fabricated in a known manner on the top layer 504 of the SMD 500.

As described above, the parasitic capacitance of the input terminal 22 and solder pads 402 and 404, and the output terminal 24 and solder pads 408 and 410, have sufficient capacitance to form the first and second capacitors C1 and C2 of the 50Ω lumped circuit. In the illustrated embodiment, discrete capacitors C1 and C2 are, thus, not necessary. However, also as described above, there are configurations in which discrete capacitors C1 and C2 are necessary. Such an arrangement is illustrated in phantom in FIG. 4. The top of the input current signal solder pad 404 is also connected to the first electrode of the first capacitor C1 (shown in phantom) via a signal trace 403 (also shown in phantom). The top of the output current signal solder pad 408 is connected to the first electrode of the second capacitor C2 (shown in phantom) via a signal trace 411 (also shown in phantom). Second electrodes of the first and second capacitors C1 and C2 are connected to the ground solder pad 422. The first and second capacitors C1 and C2 are fabricated in a known manner on the top lay er 504 of th e SMD 500.

As described above, the combination of the first and second capacitors, C1 and C2, (parasitic or discrete) and the inductance of the primary winding Wp form a lumped 50Ω network to preserve the 50Ω characteristic impedance of the signal line through the current probe 20; and the combination of the inductor L2, the resistor R2 and the inductance and resistance of the secondary winding Ws present a 50Ω output impedance at the test voltage Vtest output terminal. The overall dimensions of the SMD 500 are around 0.385 inches (0.978 cm) square. This is a relatively small component and may fit easily on a printed circuit board.

In addition, the illustrated embodiment of the current probe 20 approximates a 50Ω lumped impedance transmission line with a known time delay, both in the signal current line, and at the test voltage (Vtest) output terminal. The time delay in the illustrated current probe 20 ranges from 120 picoseconds (psec) to 170 psec, depending upon the shielding and other microwave absorbent material physically disposed around the current probe 20. This electrical characteristic simplifies modeling the performance of the current probe. Furthermore, the bandwidth of the illustrated current probe 20 runs from around 160 kilohertz (kHz) to around 3.2 GHz. This is much wider than existing current probes which can be mounted on circuit boards (e.g. U.S. Pat. No. 5,004,974, described above), and allows the illustrated current probe 20 to be used in ultra high frequency circuits.

The illustrated embodiment of the present invention has been described for a circuit being tested fabricated in the form of a circuit board, such as a printed circuit board, and the current probe has been described in the form of a surface mounted device. One skilled in the art will understand, however, that circuits being tested may be fabricated in a variety of forms, and the current probe may be fabricated in any manner appropriate for the circuit being tested. Furthermore, in the illustrated embodiment, the transmission lines carrying the signal being observed were fabricated to have a 50Ω characteristic impedance. One skilled in the art will understand that the characteristic impedance may be any appropriate value.

What is claimed is:

1. An ultra high frequency current probe for providing an output signal indicative of an amount of current flowing in a current path of a device under test, said ultra high frequency current probe comprising:

a surface mount chassis adapted to be permanently mounted to a circuit board of said device under test, said surface mount chassis including:
a current input terminal coupled to a current signal source for receiving an ultra high frequency signal;
a high frequency ferrite transformer core;
a primary winding, coupled between said current input terminal and a current output terminal, and threaded through said core;
an input capacitance coupled between said current input terminal and a point of reference potential;
an output capacitance coupled between said current output terminal and a point said point of reference potential;
said current output terminal being coupled to a current signal sink; and
a secondary winding, wound around the core, coupled between a test voltage output terminal and said source of reference potential, said secondary winding not receiving a bias current;
said test voltage output terminal generating said output signal indicative of said amount of current flowing in said current path of said device under test, said current path including said primary winding extending from said current input terminal to said current output terminal;
said test voltage output terminal providing said output signal to a test and measurement instrument;
said current signal source exhibiting a characteristic impedance;
said current signal sink exhibits said characteristic impedance; and said primary winding, said input capacitance, and said output capacitance form a lumped network exhibiting said characteristic impedance;

said impedance characteristics of said circuit under test being substantially unaffected by monitoring of said circuit under test by said test and measurement instrument.

2. The current probe of claim 1 wherein:

said input capacitance comprises a first capacitor having a first electrode coupled to said current input terminal and a second electrode coupled to ground; and said output capacitance comprises a second capacitor having a first electrode coupled to said current output terminal and a second electrode coupled to ground.

3. The current probe of claim 2 wherein:

said first capacitor is formed by parasitic capacitance of said current input terminal; and said second capacitor is formed by parasitic capacitance of said current output terminal.

4. The current probe of claim 1 wherein said secondary winding is comprised in output circuitry for exhibiting at the test voltage output terminal an output impedance equal to said characteristic impedance.

5. The current probe of claim 4 wherein said output circuitry comprises a series connection of an inductor and a resistor coupled between said test voltage output terminal and ground.

\* \* \* \* \*